United States Patent
Nakano (10) Patent No.: US 11,069,505 B2
(45) Date of Patent: Jul. 20, 2021

(54) ABERRATION CORRECTOR AND ELECTRON MICROSCOPE

(71) Applicant: HITACHI HIGH-TECH CORPORATION, Tokyo (JP)

(72) Inventor: Tomonori Nakano, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 0 days.

(21) Appl. No.: 16/473,432

(22) PCT Filed: Dec. 27, 2016

(86) PCT No.: PCT/JP2016/088875
§ 371 (c)(1),
(2) Date: Jun. 25, 2019

(87) PCT Pub. No.: WO2018/122953
PCT Pub. Date: Jul. 5, 2018

(65) Prior Publication Data
US 2020/0152414 A1     May 14, 2020

(51) Int. Cl.
*H01J 37/153*     (2006.01)

(52) U.S. Cl.
CPC ..... *H01J 37/153* (2013.01); *H01J 2237/1534* (2013.01)

(58) Field of Classification Search
None
See application file for complete search history.

(56) References Cited

U.S. PATENT DOCUMENTS

| 2008/0116391 A1* | 5/2008 | Ito | H01J 37/28 |
| | | | 250/396 ML |
| 2009/0032722 A1* | 2/2009 | Ito | H01J 37/26 |
| | | | 250/396 R |
| 2009/0079531 A1* | 3/2009 | Zach | H01J 37/26 |
| | | | 336/200 |
| 2009/0084975 A1* | 4/2009 | Zach | H01J 1/50 |
| | | | 250/396 ML |

FOREIGN PATENT DOCUMENTS

| JP | 2004024119 A | * | 1/2004 | |
| JP | 2004024119 A | | 1/2004 | |
| JP | 2009054581 A | * | 3/2009 | ........... H01J 37/153 |
| JP | 2009054581 A | | 3/2009 | |
| JP | 2009081138 A | * | 4/2009 | ............... H01J 1/50 |
| JP | 2009081138 A | | 4/2009 | |

OTHER PUBLICATIONS

International Search Report dated Mar. 14, 2017, for PCT/JP2016/088875.

* cited by examiner

*Primary Examiner* — Andrew Smyth
(74) *Attorney, Agent, or Firm* — Miles & Stockbridge, P.C.

(57) ABSTRACT

In order to provide an aberration corrector with a wide aberration correction range, easy control, highly accurate aberration correction, and a low cost, an aberration corrector, passing an electron beam through a central axis 201, includes a first current line group (101 to 112) which is arranged parallel to an optical axis at a position separated by R1 from the central axis, and excites a first multipole field, and a second current line group (21 to 32) which is arranged parallel to the optical axis at a position separated by R2 from the central axis, and independently excites a second multipole field having an order and intensity different from those of the first multipole field.

11 Claims, 6 Drawing Sheets

ABERRATION CORRECTOR AND ELECTRON MICROSCOPE

TECHNICAL FIELD

The present invention relates to an aberration corrector and an electron microscope.

BACKGROUND ART

In an electron microscope such as a scanning electron microscope (hereinafter referred to as SEM) or a scanning transmission electron microscope (hereinafter referred to as STEM), an aberration corrector is introduced to improve the resolution. The aberration corrector includes multipole lenses provided in multiple stages, an electric field or a magnetic field is generated to form the multipole lens in which a plurality of multipole fields are combined, and an aberration included in an electron beam passing through the aberration corrector is removed. PTL 1 discloses an aberration corrector using a multipole. In PTL 1, a plurality of wedge type poles made of metal are arranged radially in a central axis direction, and an electric field or a magnetic field is applied to each of the poles to generate a multipole field. PTL 2 and PTL 3 disclose a technique for generating a multipole field by directly using a magnetic field from a current line instead of the wedge type multipole. Here, a wire of the wedge type pole is used. Both of the wedge type and a wire type aberration corrector require mechanically high position accuracy.

PRIOR ART LITERATURE

Patent Literature

PTL 1: JP-A-2004-24119
PTL 2: JP-A-2009-054581
PTL 3: JP-A-2009-81138

SUMMARY OF INVENTION

Technical Problem

Since the aberration corrector described in PTL 1 includes a plurality of components and a pole tip needs to satisfy high position accuracy, it is difficult to produce the aberration corrector in a large amount, and the manufacturing time and cost are problematic. Therefore, the inventors focus on and study on a wire type aberration correction technique in which aberration correction can be performed at a low cost.

The wire type aberration corrector capable of reducing the cost has been proposed, for example, in PTL 2. Here, a multipole is formed with a current line as one pole or a plurality of same current lines bundled as one pole; however, due to spatial restriction caused by a current line position and diameter, and an upper limit of the current that can be applied to the current line since the current line group surrounding the central axis is a single layer, it is concerned that the intensity of the multipole field is limited and the range of applicable conditions is narrowed. The multipole field is excited by superimposing a plurality of fields such as a quadrupole field and a hexapole field. At this time, although a current amount and sensitivity required by the multipole field are different, a power source for applying the current is the same. Since a maximum current is determined according to a situation where the maximum intensity is required and a minimum value of a change width is determined according to the highest sensitivity, it is considered that a strict specification of control accuracy of the power source needs to be satisfied.

PTL 3 discloses a configuration in which a multipole field is formed with a square-shaped wiring at a constant distance from a central axis as one pole. One pole is widened in a circumferential direction ($\theta$ direction) and the wiring is wound a plurality of times in one pole to increase the multipole field intensity; however, since the poles overlap with each other, the poles with different distances from the central axis to the pole are not constant, and it is concerned that an unnecessary aberration occurs to degrade the performance. Further, in the configuration of PTL 3, since one pole has two-dimensional spread in a square shape, it is concerned that it is difficult to obtain position accuracy, and an unnecessary leakage magnetic field is generated in a vertical direction from the upper and lower current lines of the square wiring.

An object of the invention is to provide an aberration corrector and an electron microscope with a wide aberration correction range, easy control, highly accurate aberration correction, and a low cost.

Solution to Problem

As one aspect to achieve the above object, there is provided an aberration corrector including:

an opening through which an electron beam passes through a central axis;

a first current line group which is arranged parallel to an optical axis at a position separated by a first radius from the central axis, and excites a first multipole field; and a second current line group which is arranged parallel to the optical axis at a position separated by a second radius longer than the first radius, and independently excites a second multipole field having an order and intensity different from those of the first multipole field.

In addition, in another aspect, there is provided an electron microscope including an electron source, an aberration corrector which corrects an aberration of an electron beam emitted from the electron source, and an electron optical system which irradiate a sample with the electron beam, in which the aberration corrector includes an opening through which an electron beam passes through a central axis, a first current line group which is arranged parallel to an optical axis at a position separated by a first radius from the central axis, and excites a first multipole field, and a second current line group which is arranged parallel to the optical axis at a position separated by a second radius longer than the first radius, and independently excites a second multipole field having an order and intensity different from those of the first multipole field.

Advantageous Effect

According to the invention, it is possible to provide an aberration corrector and an electron microscope with a wide aberration correction range, easy control, highly accurate aberration correction, and a low cost.

DESCRIPTION OF EMBODIMENTS

As a result of studying on performance improvement of a low cost wire type aberration corrector, the inventors believe that in a multipole lens for one stage of an aberration corrector in which an electron beam passes through a central axis, a plurality of current lines arranged circumferentially by a constant radius parallel to an optical axis are regarded as one set, and a plurality of such sets with different radii are arranged (multilayer arrangement), and it is sufficient to excite and control multipole fields of different types and intensities independently for each set.

Accordingly, by arranging the current line group surrounding the central axis in a multilayer arrangement configuration, the excitation intensity can be set according to the required intensity of the multipole, so that the application range is widened in the wire type aberration corrector. In addition, a maximum value and a change step of a power source output used can be optimized.

Hereinafter, the invention will be described using embodiments with reference to the drawings. Although a scanning electron microscope is described as an example in the embodiment, it can be applied generally to an electron microscope. The same reference numerals denote the same components.

First Embodiment

Figure 1:
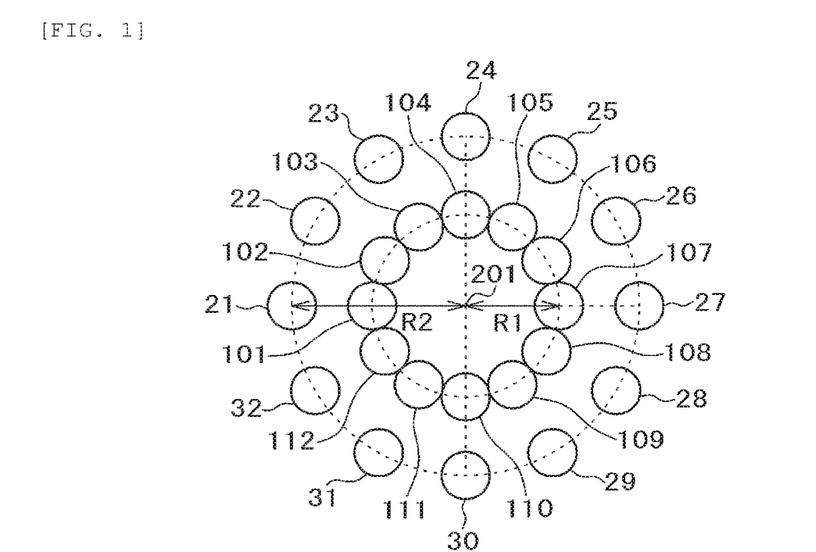
FIG. 1 is a schematic plan view showing an example of a multilayer wire arrangement configuration in an aberration corrector according to a first embodiment of the invention.

FIG. 1 is a schematic plan view of a configuration example of a multilayer wire in an aberration corrector according to a first embodiment of the invention. FIG. 1 shows multilayer arrangement of two current line groups, that is, current lines 101 to 112 on a radius R1 and current lines 21 to 32 on a radius R2, with an optical axis (central axis) 201 of an electron beam traveling perpendicular to a paper surface as a center. The current passing through the current lines in FIG. 1 flows in a direction same as or opposite to the direction of the electron beam parallel to the optical axis 201. For example, currents $I_i$ (i=1 to 12) of the current lines 101 to 112 exciting a 2N-pole field (N is an integer greater than or equal to 1, for example, N=1 is a dipole field, and N=2 is a quadrupole field) are a combination of Equation (1) with respect to a reference current $A_N$. (Positive and negative signs of $I_i$ represent the direction of the current.)

$$I_i = A_N \cdot \text{Cos}(N(i-1)\pi/6) \quad \text{[Equation 1]}$$

Figure 2:
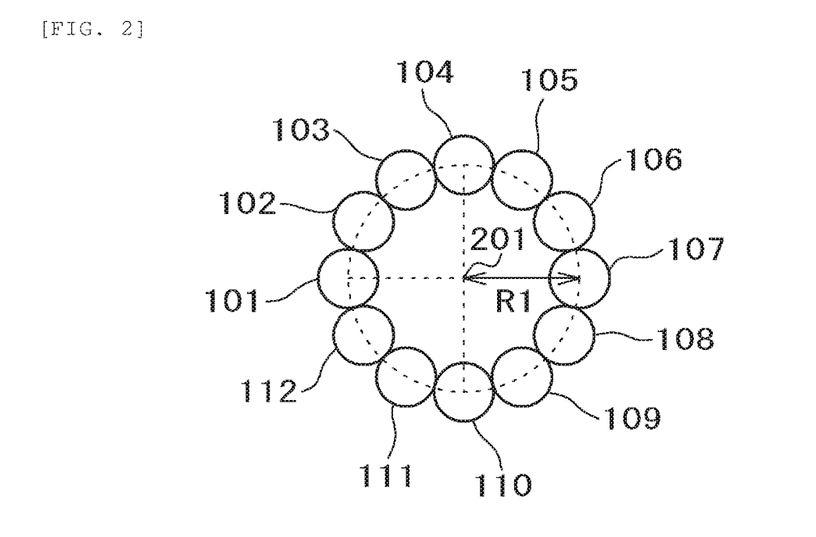
FIG. 2 is a schematic plan view showing an example of a single-layer wire arrangement in a related-art aberration corrector.

In a multipole lens of the aberration corrector, a plurality of multipole fields are superimposed at the same stage since a plurality of aberrations such as a spherical aberration and a coma aberration are corrected. In a related-art single-layer wire lens which includes the current lines 101 to 112 shown in FIG. 2, the current of each wire is a sum of N=1 to 4 and 6 (N=5 is not possible for a configuration of FIG. 2 and is thus excluded) as shown in Equation (2) in order to superimpose a plurality of fields. As for until which number the sum is obtained, it is 6 since the number of lines is 12 in FIG. 2, but the number can be increased as the number of lines increases, and N=5 can also be included.

$$I_i = A_1 \cdot \text{Cos}((i-1)\pi/6) + A_2 \cdot \text{Cos}(2(i-1)\pi/6) + \ldots = \sum_{N=1} A_N \cdot \text{Cos}(N(i-1)\pi/6) \quad \text{[Equation 2]}$$

In FIG. 1, the controllability of the multipole field can be improved by exciting different types of multipole fields for each layer of the current line groups, such as N=4 (octupole field) in the current lines 101 to 112 and N=2 (quadrupole field) in the current lines 21 to 32. For example, since the sum of the currents of the multipole fields is obtained in Equation (2), a combination of intensities of the fields in which the current reaches an upper limit and which cannot be controlled occurs discontinuously due to a difference in periodicity, but the upper limit is uniquely determined without considering the combination if only a specific multipole field is output.

Figure 3:
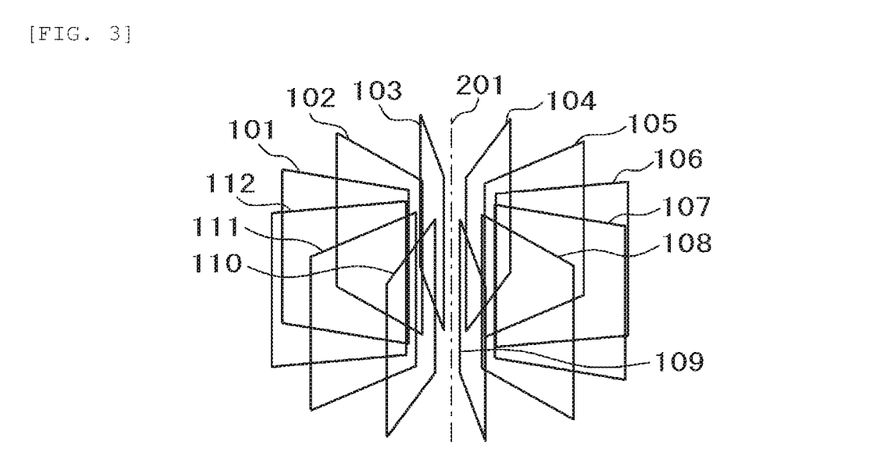
FIG. 3 is a schematic perspective view for explaining the appearance of the multilayer wire shown in FIG. 1.
Figure 4A:
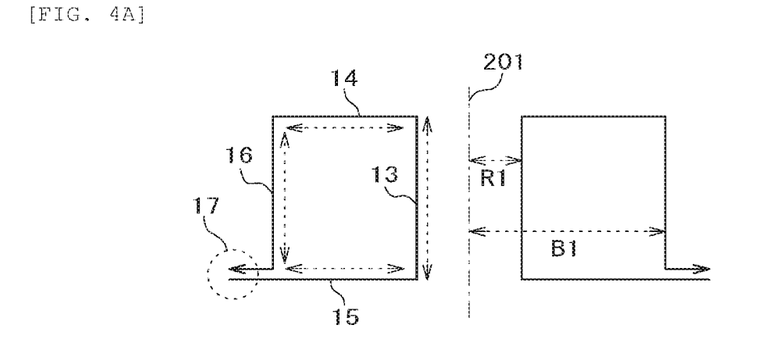
FIG. 4A is a schematic cross-sectional view for explaining one component of the multilayer wire shown in FIG. 1.

The current line groups are shown in a simplified form in FIG. 1, while actually has an appearance as shown in the perspective view of FIG. 3. Specifically, FIG. 3 shows the current lines 101 to 112 shown in FIG. 1 including wirings other than the optical axis and parallel parts, and each wiring forms a square wiring on a plane formed by the optical axis 201 and each current line (a direction of the square wiring is different from that of PTL 3). Among these, current lines of two poles facing each other with the optical axis 201 as a reference are shown in FIG. 4A. In FIG. 4A, a current line 13 part on the optical axis side is defined as a main line, a current line 14 upper part and a current line 15 lower part are defined as sub-lines, and a current line 16 part separated from the optical axis 201 by a radius B1 is defined as a return line. Although the wiring has a squared shape, it may also be a circle, a triangle, or the like if formed on the same surface. If absolute values of the current amounts of the same main line group are the same, the main lines can connect the input and the output of a connection unit 17 in series to supply current with one power source.

The multipole field is formed mainly by the magnetic field of the main line, and the wiring other than the main line is not necessary to form a multipole field in principle. Since the current flows through the return line in a direction opposite to the main line, a multipole field with a polarity opposite to that of the main line is generated, and this has an effect of reducing the multipole field intensity. To prevent this, the radius B1 may be larger than the radius R1. Hereinafter, the distance from the return line to the optical axis is larger than the distance from the main line to the optical axis, and only the main line is described as shown in FIG. 1 unless otherwise specified.

Figure 4B:
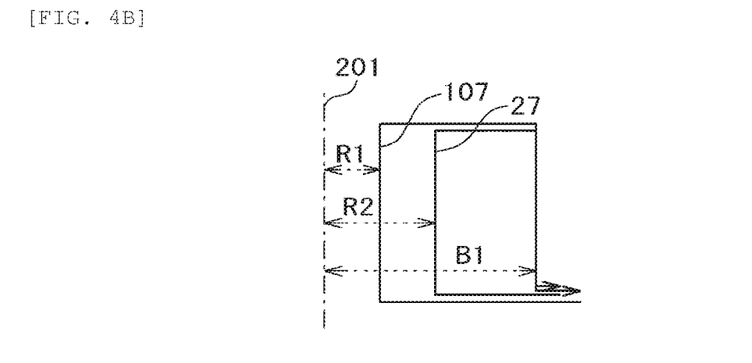
FIG. 4B is a schematic cross-sectional view for explaining a specific example of a multilayer configuration of the multilayer wire shown in FIG. 1.

FIG. 4A shows a case of a single-layer wire, and FIG. 4B shows the current line 107 and the current line 27 as examples in a case of a multilayer wire. The distance from the optical axis 201 to the current line 107 is R1, and the distance from the optical axis 201 to the current line 27 is R2, and the distances R1 and R2 are values sufficiently smaller than the distance B1 from the optical axis 201 to the respective return lines. Although there is a gap between the upper and lower sub-lines of the current line 107 and the upper and lower sub-lines of the current line 27 in the drawings, they are actually arranged adjacent to each other. It is desirable that the upper and lower sub-lines of the current line 107 and the upper and lower sub-lines of the current line 27 are arranged to overlap each other in the plain view.

Figure 5:
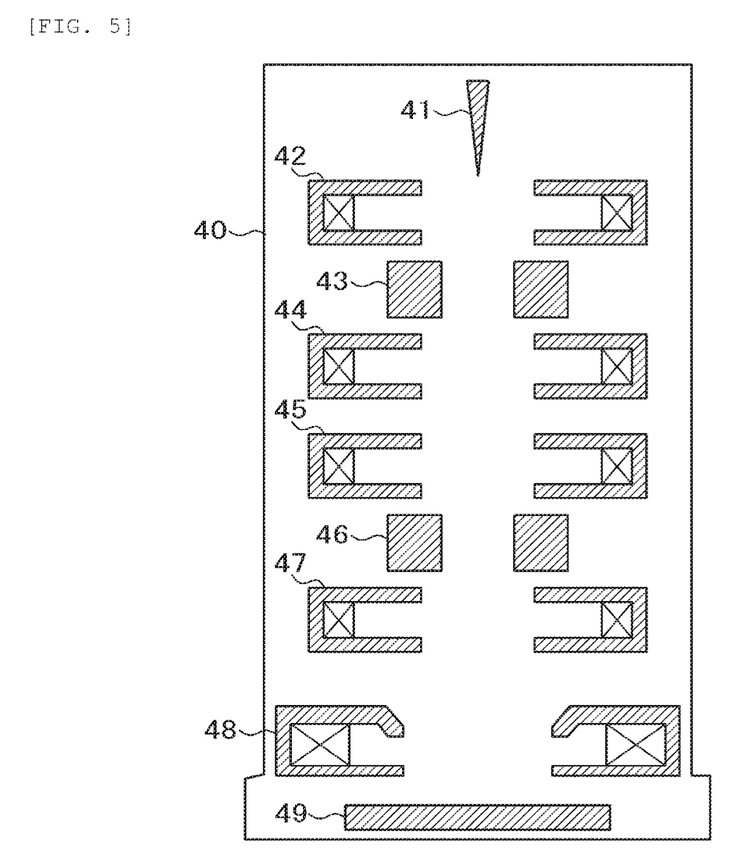
FIG. 5 is a schematic cross-sectional view showing an example of an overall configuration of an electron microscope (scanning electron microscope) according to each embodiment of the invention.

FIG. 5 is a schematic cross-sectional view showing an example of the overall configuration of the scanning electron microscope according to the present embodiment. The scanning electron microscope (SEM) incorporates an aberration corrector including the multilayer wire shown in FIG. 1. In this SEM, a primary electron beam (not shown) is emitted from an electron gun 41, and a parallel beam is formed by a condenser lens 42 and passes through a multipole lens 43. The primary electron beam passed through the multipole lens 43 is transferred to a multipole lens 46 by a condenser lens 44 and a condenser lens 45. Then, the primary electron beam receives a convergence action by a condenser lens 47 and an objective lens 48 and is emitted onto a sample 49. An inside of a vacuum chamber 40 is evacuated, and the electron beam proceeds from the electron gun 41 to the sample 49 in a vacuum state. The multipole lens 43 and the multipole lens 46 include the multilayer wire group shown in FIG. 1, and a hexapole field is excited to perform a spherical aberration correction. This spherical aberration optical system is an optical system same as a general aberration corrector used in the STEM or the like. The spherical aberration correction can be performed at a low cost by using a multilayer wire multipole as the multipole lenses 43 and 46, instead of a wedge type multipole. In addition, compared with the single-layer wire multipole, the aberration correction range is wide, the control is easy, and a high accuracy observation can be performed. The wire multipole is also applicable as a multipole lens of a four-stage aberration corrector using a quadrupole field and an octupole field other than that in the present embodiment.

According to the above embodiment, it is possible to provide an aberration corrector or an electron microscope with a wide aberration correction range, easy control, highly accurate aberration correction, and a low cost.

Second Embodiment

An aberration corrector according to a second embodiment of the invention will be described with reference to FIG. 6 and FIG. 7. The matters described in the first embodiment and not described in the present embodiment can also be applied to the present embodiment unless otherwise specified.

The present embodiment shows a configuration of a multilayer wire multipole in which efficient multipole field intensity is obtained. FIG. 6 is a schematic view of the multilayer wire multipole, in which main line groups 50, 51, and 52 are arranged at respective radii with the optical axis 201 of a charged particle beam traveling perpendicular to the paper surface as a center. Each of the main line groups 50 to 52 is formed of 12 circular current lines with the same phase, and the radius of the current line is set to obtain a maximum radius $R_{max}$ in each arrangement. The maximum radius $R_{max}$ of the current line group formed by 12 current lines is given by Equation (3) with respect to the distance R1 from the main line to the optical axis 201.

$$R_{max} = R1 \cdot \sin(\lambda/12) \quad \text{[Equation 3]}$$

Although the current line is actually coated and insulated, it is omitted in this description for the sake of brevity.

The upper limit of the current value which can be applied to the current line depends on an area and material of the current line excluding external factors such as temperature. An allowable current density $J_{max}$ in an area unit is determined with respect to the material. On the other hand, if the current of the current line is constant, the intensity $Bw_{max}$ of the 2N-pole field is proportional to the (N−1)th power of (1/R1) as shown in Equation (4).

$$Bw_{max} \propto \frac{I_N}{R1^N} \quad \text{[Equation 4]}$$

When the current flows to an allowable current as the upper limit, the reference current $A_N$ is shown by Equation (5).

$$A_N = J_{max} \cdot R_{max}^2 = J_{max} \cdot R1^2 \cdot \sin^2(\pi/12) \quad \text{[Equation 5]}$$

When the Equation (5) is combined with the Equation (4), the intensity $B_{wmax}$ of the 2N-pole field is expressed by Equation (6).

$$Bw_{max} \propto \frac{J_{max}}{R1^{N-2}} \quad \text{[Equation 6]}$$

Figure 7:
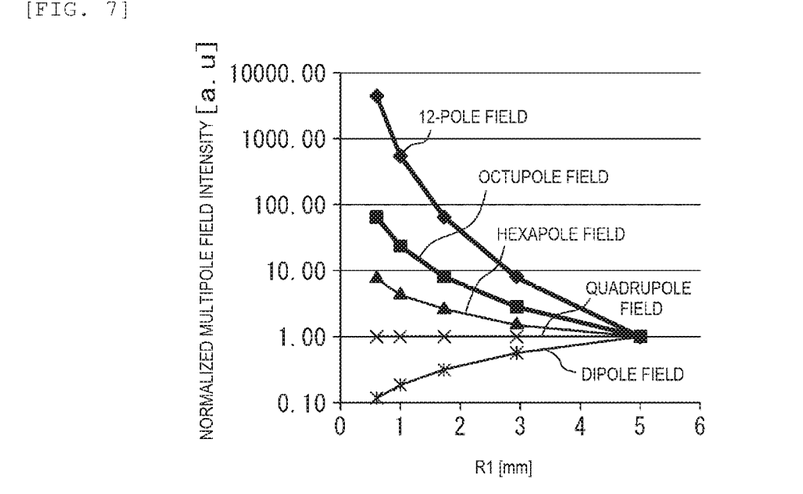
FIG. 7 is a graph showing a relationship between a distance R1 from an optical axis to a wire and multipole field intensity.

The $B_{wmax}$ of the Equation (6) is normalized and graphed at an intensity of R1=5 mm, as shown in FIG. 7. Considering the upper limit of the current for the 12-pole wire, it is necessary to increase the distance R1 from the center for a dipole field and to shorten the R1 for a hexapole field or more in order to increase the multipole field intensity. In addition, since the intensity is constant for a quadrupole field, it is necessary to increase the length of the current line in the optical axis direction to gain a working distance. Accordingly, since the change amount of the multipole field intensity with respect to R1 varies depending on the type of the multipole field, it is difficult to design R1 in the single-layer wire. Particularly, an application condition of the aberration corrector of the wire multipole with respect to an accelerating voltage, an optical magnification, a working distance, and the like becomes narrow. In contrast, in the multilayer wire, R1 can be set according to the sensitivity of each multipole, so that the application condition is widened.

In principle, based on the property of FIG. 7, it is desirable set a higher-order multipole field (N of the 2N-pole field is large) to a layer on the optical axis side in the multilayer wire multipole. Accordingly, the influence of a power source noise can be prevented. The noise can be regarded as a relatively low order component such as a dipole field component or a quadrupole component included in the multipole field, and according to FIG. 7, when R1 is reduced, the intensity ratio of the quadrupole field or more increases with respect to the dipole field, so that the influence is relatively small.

On the other hand, since the multipole field requiring the maximum magnetic field intensity differs depending on the type of the aberration corrector, the layer to be allocated is finally set according to the require and intensity. For example, since in the aberration corrector of the type shown in FIG. 5 of the first embodiment, the intensity of the hexapole field is mostly required, hexapoles are assigned to the layer on the axis side regardless of the principle.

Figure 6:
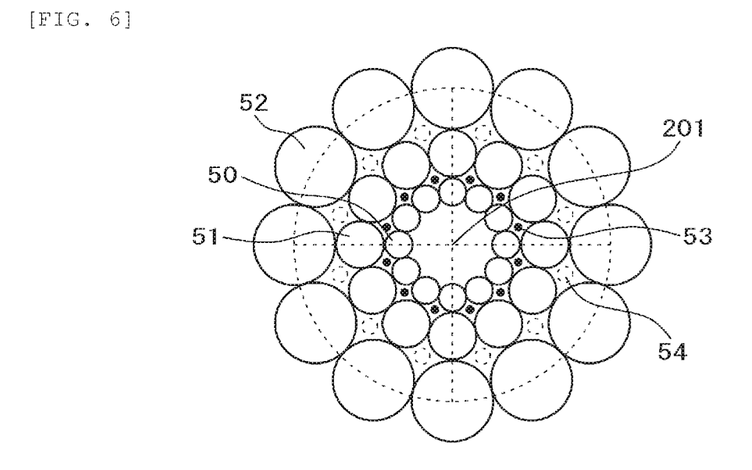
FIG. 6 is a schematic plan view showing an example of a multilayer wire arrangement configuration in an aberration corrector according to a second embodiment of the invention.

In FIG. 6, a main line group 53 and a main line group 54 for exciting an auxiliary multipole field are arranged at a phase deviated by half from an arrangement angle of the main line groups 50 to 52. The radii of the main line groups 53 and 54 are set to be smaller than those of the main line groups 50 to 52 so as to not have an influence on the main line groups 50 to 52. The purpose of the auxiliary multipole field is to compensate for a deviation of the multipole field generated in the main line groups 50 to 52. For example, when a hexapole field is excited in the main line group 50, a hexapole field component rotated from the hexapole field to be originally applied may be included due to a mechanical deviation. In this case, the main line group 53 excites a hexapole field which cancels the rotational component. Since the rotational component is small if the mechanical accuracy is high, and the current amount applied is small, a diameter of the current line of the auxiliary multipole field is reduced. Although the rotational component can be superimposed on the main line 53, there is a problem that the number of necessary power sources increases.

The aberration corrector including the multilayer wire multipole shown in FIG. 6 is mounted on the scanning electron microscope shown in FIG. 5 to observe the sample, and as a result, the aberration correction range is wide, the control is easy, and high accuracy observation can be performed.

According to the above embodiment, the same effect as that of the first embodiment can be obtained. Further, it is possible to perform more accurate aberration correction by providing the auxiliary multipole field.

Third Embodiment

An aberration corrector according to a third embodiment of the invention will be described with reference to FIG. 8 and FIG. 9. The matters described in the first or second embodiment and not described in the present embodiment can also be applied to the present embodiment unless otherwise specified.

In the present embodiment, a multilayer wire multipole has a configuration applicable to a wide range with respect to changes in a condition such as an accelerating voltage, an optical magnification, and a working distance. FIG. 8 is a schematic plan view for explaining an example of a multilayer wire arrangement and a method for supplying a current to a multilayer wire in an aberration corrector according to the present embodiment. In FIG. 8, a power source 81 and a power source 82 for applying the multipole current are provided, and a target to be applied with a current by the power source 81 and the power source 82 is switched to any two of the wire groups 50 to 52 by a switcher 83 and a switcher 84 according to an instruction from a control unit 80.

When the accelerating voltage is high or WD is small, it is necessary to increase the multipole field intensity so as to increase the correction amount. In this case, the power source 81 is connected to the main line group 50 and the power source 82 is connected to the main line group 51 so as to reduce R1 with respect to the hexapole field and the octupole field. On the contrary, when the accelerating voltage is lower or the WD is large, the power source 81 is connected to the main line group 51 and the power source 82 is connected to the main line group 52 so as to increase R1 with respect to the hexapole field and the octupole field. Accordingly, when switching is performed according to the condition, the output of the power source 81 can be kept within a certain range. It is considered that it is sufficiently to simply reduce the output of the current in low acceleration or the like; however, in practice, the current changing step, the stability (ripple noise amount), and the like are required to be smaller proportionally, so that the method of reducing the output is not preferable because the power source cost increases.

In the above embodiment, one type of multipole field is occupied for one layer, but it is not necessary to limit it to one type of multipole field in all layers of the multilayer. The multipole fields that are relatively weak and do not reach the upper limit of the current may superpose with each other without a problem. In particular, when the accelerating voltage changes, the combination to be superimposed or the number of power sources to be used may be changed according to the type and amount of the aberration to be corrected due to changes in influence degree of a chromatic aberration. The configuration shown in FIG. 9 is obtained by adding a power source 85 for applying a multipole current to the configuration of FIG. 8. According to the command from the control unit 80, a switcher 86 can switch a target to be applied with a current by the power source 85 between a state of being connected to the wire group 52 and a state of not being connected. When the power source 82 is connected to the main line group 52, the power source 85 is not connected, and a plurality of fields are superimposed and excited in the main line group 52.

Figure 8:
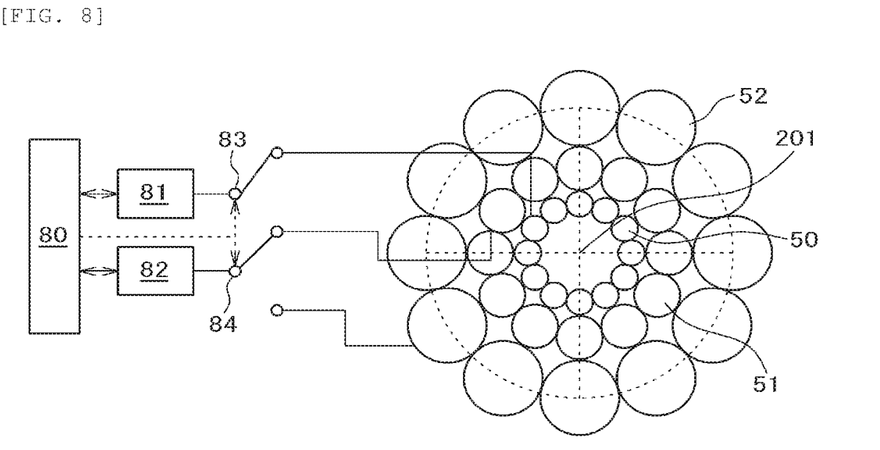
FIG. 8 is a schematic plan view for explaining an example of a multilayer wire arrangement and a method for supplying a current to a multilayer wire in an aberration corrector according to a third embodiment of the invention.
Figure 9:
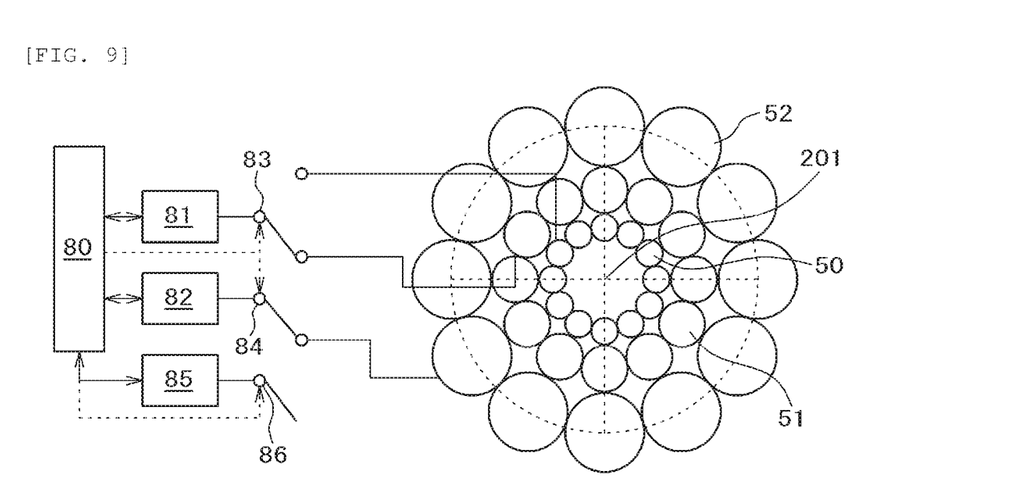
FIG. 9 is a schematic plan view for explaining another example of the multilayer wire arrangement and the method for supplying a current to the multilayer wire in the aberration corrector according to the third embodiment of the invention.

The aberration corrector including the multilayer wire multipole and the power source switching unit shown in FIG. 8 or FIG. 9 is mounted on the scanning electron microscope shown in FIG. 5 to observe the sample, and as a result, the aberration correction range is wide, the control is easy, and high accuracy observation can be performed.

According to the above embodiment, the same effect as that of the first embodiment can be obtained. Further, by including the power source switching unit, it is possible to apply a wider range with respect to the changes in the condition such as an accelerating voltage, an optical magnification, and a working distance.

Fourth Embodiment

An aberration corrector according to a fourth embodiment of the invention will be described with reference to FIG. 10. The matters described in any one of the first to third embodiments and not described in the present embodiment can also be applied to the present embodiment unless otherwise specified.

Figure 10:
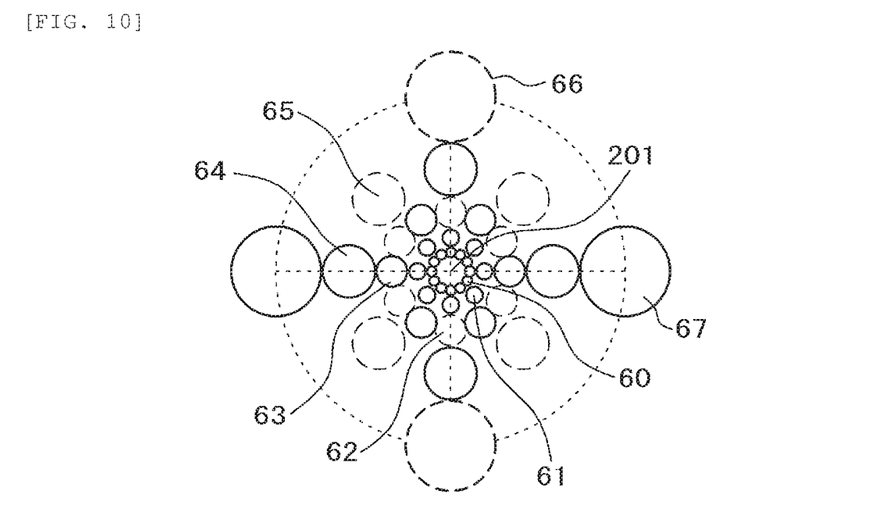
FIG. 10 is a schematic plan view showing an example of a multilayer wire arrangement configuration in an aberration corrector according to a fourth embodiment of the invention.

FIG. 10 is a schematic plan view showing an example of a multilayer wire arrangement configuration in the aberration corrector according to the present embodiment.

Although the number of current lines in the wire group is shown to be 12, the number of lines can be changed for each layer as shown in FIG. 10. Here, with respect to the optical axis 201, a main line group 61 including 8 lines, a main line group 62 and a main line group 63 each including 6 lines, a main line group 64 and a main line group 65 each including 4 lines, and a main line group 66 and a main line group 67 each including 2 lines are arranged on an outer side of a main line group 60 including 12 lines at an innermost circumference. A 12-pole field is applied to the main line group 60, an octupole field is applied to the main line group 61, a hexapole field is applied to each of the main line groups 62 and 63, a quadrupole field is applied to each of the main line groups 64 and 65, and a dipole field is applied to each of the main line groups 66 and 67. A set of main line groups with the same number of lines and distance from the center is a combination of phases deviated by half from the arrangement angle. A different phase may be provided for all the main line groups although some of which are omitted in FIG. 10.

When the number of lines is not 12, the current $I_i$ to be applied to the wire can be expressed by Equation (7), wherein M is the number of current lines forming the line group.

$$I_i = A_N \cdot \text{Cos}(2N(i-1)\pi/M) \quad \text{[Equation 7]}$$

Here, when M is 2N, Equation (8) is formed, the input and output positions of the current line can be connected in series while being exchanged.

$$I_i = A_N \cdot \text{Cos}((i-1)\pi) = A_N \cdot (-1)^{i-1} \quad \text{[Equation 8]}$$

As described above, the structure can be simplified when the multipole field set in advance is limited. The configuration of the present embodiment is advantageous when use conditions are limited.

The aberration corrector including the multilayer wire multipole shown in FIG. 10 is mounted on the scanning electron microscope shown in FIG. 5 to observe the sample, and as a result, the aberration correction range is wide, the control is easy, and high accuracy observation can be performed.

According to the above embodiment, the same effect as that of the first embodiment can be obtained. In addition, the structure can be simplified when the multipole field set in advance is limited.

Fifth Embodiment

An aberration corrector according to a fifth embodiment of the invention will be described with reference to FIG. 11. The matters described in any one of the first to third embodiments and not described in the present embodiment can also be applied to the present embodiment unless otherwise specified.

In the above embodiment, a 2N-pole field is also excited by using the multilayer wire, but a general deflector can be arranged on the outermost circumference with respect to the dipole field. With respect to the main line groups 66 and 67 shown in the configuration of FIG. 10 of the fourth embodiment, an extra aberration is generated other than the main purpose dipole field. On the other hand, a general deflector may be used for the excitation of a dipole field, and the deflector is unlikely to cause an extra aberration, a positional deviation, and the like due to a distribution wire or the like.

Figure 11:
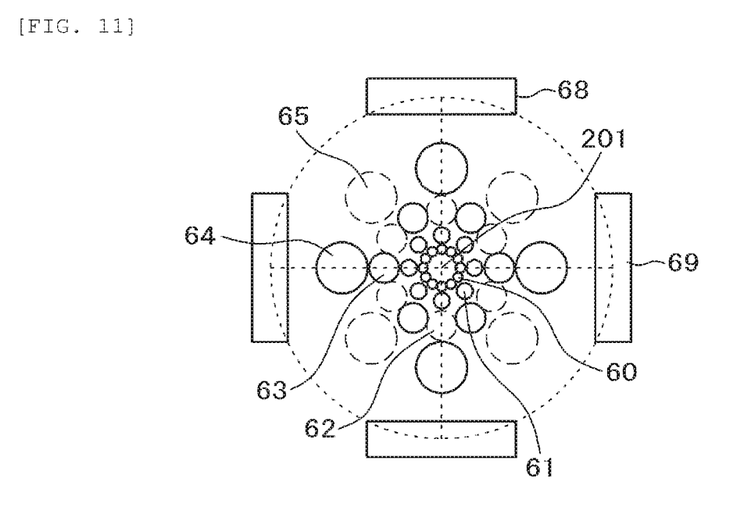
FIG. 11 is a schematic plan view showing an example of a multilayer wire arrangement configuration in an aberration corrector according to a fifth embodiment of the invention.

FIG. 11 is a schematic plan view showing an example of a multilayer wire arrangement configuration in the aberration corrector according to the present embodiment. In FIG. 11, a wire multipole is configured by using a deflector 68 and a deflector 69 instead of a wire dipole. In the case of a wedge type multipole, the pole is a magnetic material, and there is a magnetic shield even when the deflector is arranged on the outer circumference; therefore, it is difficult to achieve the configuration as in the present embodiment. Accordingly, the wire multipole also has a feature that a general deflector can be arranged outside.

The aberration corrector including the multilayer wire multipole shown in FIG. 11 is mounted on the scanning electron microscope shown in FIG. 5 to observe the sample, and as a result, the aberration correction range is wide, the control is easy, and high accuracy observation can be performed.

According to the above embodiment, the same effect as that of the first embodiment can be obtained. Further, by using the deflector instead of the wire dipole, it is possible to reduce the occurrence of the extra aberration other than the dipole field.

The invention is not limited to the embodiments described above, and includes various modifications. For example, the embodiments described above have been described in detail for easy understanding of the invention, and are not necessarily limited to those including all the configurations described above. Further, a part of a configuration of a certain embodiment may also be replaced with a configuration of another embodiment, and the configuration of another embodiment may also be added to the configuration of the certain embodiment. In a part of a configuration of each embodiment, another configuration can be added, removed, or replaced.

REFERENCE SIGN LIST 101 to 112 current line
13 current line main line part
14 current line upper sub-line part
15 current line lower sub-line part
16 current line return part
17 current line input/output part
21 to 32 current line
40 vacuum vessel
41 electron gun
42 condenser lens
43 multipole lens
44 condenser lens
45 condenser lens
46 multipole lens
47 condenser lens
48 objective lens
49 sample
50 main line group
51 main line group
52 main line group
53 main line group
54 main line group
60 main line group
61 main line group
62 main line group
63 main line group
64 main line group
65 main line group
66 main line group
67 main line group
68 deflector
69 deflector
80 control unit 81 power source
82 power source
83 switcher
84 switcher
85 power source
86 switcher
201 optical axis (central axis)

The invention claimed is:

1. An electron microscope comprising:
an electron source;
an aberration corrector which corrects an aberration of an electron beam emitted from the electron source; and
an electron optical system which irradiates a sample with the electron beam, wherein
the aberration corrector includes
an opening through which the electron beam passes through a central axis,
a first current line group comprising a plurality of first elements each of which comprises a main line portion which is arranged to extend in a same direction as an optical axis so as to be parallel to said optical axis and spaced apart from said optical axis at a position separated by a first constant distance radius from the central axis, and excites a first multipole field, and
a second current line group comprising a plurality of second elements each of which comprises a main line portion which is also arranged to extend in the same direction as the optical axis so as to be parallel to the optical axis and spaced apart from said optical axis at a position separated by a second constant distance radius longer than the first constant distance radius, and independently excites a second multipole field having an order and intensity different from those of the first multipole field,
wherein each line of said first and second current line groups is disposed in a plane which also includes said optical axis,
wherein each of said plurality of elements of the first current line group and each of said plurality of elements of the second current line group further comprises a return line portion arranged to extend in the same direction as said main line portion and spaced apart from said optical axis, and in which a current flows in a direction away from said optical axis at a position separated by a third constant distance radius which is greater than both of said first constant distance radius and said second constant distance radius, and
wherein distances between said third constant distance radius and each of the first and second constant distance radii are sufficiently large to cause said current which flows through said return line portion in a direction away from said optical axis to have no effect on multipole field intensities of said first multipole field provided by said main line portion of said first current line group, and said second multipole field provided by said main line portion of said second current line group.

2. The electron microscope according to claim 1, wherein the number of lines of the first current line group is 12 or more.

3. The electron microscope according to claim 1, wherein the first multipole field has an order higher than that of the second multipole field.

4. The electron microscope according to claim 1, wherein a diameter of a current line constituting the second current line group is larger than a diameter of a current line constituting the first current line group.

5. The electron microscope according to claim 1, wherein the first multipole field is a multipole field of a hexapole or more, and when the second multipole field and the first multipole field are excited under a condition of the same distance from the axis, a current amount of the first multipole field is larger.

6. The electron microscope according to claim 1, further comprising:
a power source;
a switcher which changes a current path from the power source; and
a control unit, wherein
the control unit controls the switcher to switch a current line group driven by the power source between the first current line group and the second current line group according to an accelerating voltage, or an optical magnification, or a working distance.

7. The electron microscope according to claim 1, further comprising:
a third current line group which is arranged parallel to the optical axis at a position separated by a fourth constant distance radius different from the first and second constant distance radii in length, wherein
the second constant distance radius is smaller than the fourth constant distance radius, the fourth constant distance radius is smaller than the third constant distance radius, and a third multipole field is excited in the third current line group.

8. The electron microscope according to claim 1, wherein the number of lines of the first current line group and the number of lines of the second current line group are respectively a multiple of 4 or a multiple of 6, or a 4N-pole field or a 6M-pole field (N and M are natural numbers) is excited.

9. An aberration corrector comprising:
an opening through which an electron beam passes through a central axis;
a first current line group comprising a plurality of first elements each of which comprises a main line portion which is arranged to extend in a same direction as an optical axis so as to be parallel to said optical axis and spaced apart from said optical axis at a position separated by a first constant distance radius from the central axis, and excites a first multipole field, and
a second current line group comprising a plurality of second elements each of which comprises a main line portion which is also arranged to extend in the same direction as the optical axis so as to be parallel to the optical axis and spaced apart from said optical axis at a position separated by a second constant distance radius longer than the first constant distance radius, and independently excites a second multipole field having an order and intensity different from those of the first multipole field,
wherein each line of said first and second current line groups is disposed in a plane which also includes said optical axis,
wherein each of said plurality of elements of the first current line group and each of said plurality of elements of the second current line group further comprises a return line portion arranged to extend in the same direction as said main line portion and spaced apart from said optical axis in which a current flows in a direction away front said optical axis at a position separated by a third constant distance radius which is greater than said first constant distance radius and said second constant distance radius, and wherein distances between said third constant distance radius and each of the first and second constant distance radii are sufficiently large to cause said current which flows throws said return line portion in a direction away from said optical axis to have no effect on multipole field intensities of said first multipole field provided by said main line portion of said first current line group, and said second multipole field provided by said main line portion of said second current line group.

10. The aberration corrector according to claim 9, wherein the first multipole field excited by the first current line group arranged on the first constant distance radius smaller than the second constant distance radius has an order higher than that of the second multipole field.

11. The aberration corrector according to claim 9, wherein a diameter of a current line constituting the second current line group arranged on the second constant distance radius larger than the first constant distance radius is larger than a diameter of a current line constituting the first current line group.

* * * * *